United States Patent [19]

Nishigaki et al.

[11] Patent Number: 4,650,923
[45] Date of Patent: Mar. 17, 1987

[54] CERAMIC ARTICLE HAVING A HIGH MOISTURE PROOF

[75] Inventors: Susumu Nishigaki; Junzo Fukuda, both of Nagoya; Masashi Fukaya, Kuwana; Shinsuke Yano, Nagoya, all of Japan

[73] Assignee: Narumi China Corporation, Nagoya, Japan

[21] Appl. No.: 740,184

[22] Filed: May 31, 1985

[30] Foreign Application Priority Data

Jun. 1, 1984 [JP] Japan .................................. 59-110988
Oct. 5, 1984 [JP] Japan .................................. 59-208000
May 30, 1985 [JP] Japan .................................. 60-115225

[51] Int. Cl.[4] .............................................. H05K 1/03
[52] U.S. Cl. ................................ 174/68.5; 361/411; 361/414; 501/73; 501/77
[58] Field of Search .................. 174/68.5; 501/73, 77; 361/411, 414

[56] References Cited

U.S. PATENT DOCUMENTS 3,236,662  2/1966  MacDowell ................ 501/73 X
4,313,900  2/1982  Gonzales et al. ........... 501/73 X
4,490,429  12/1984  Tosaki et al. ............. 174/68.5 X Primary Examiner—R. R. Kucia
Attorney, Agent, or Firm—Hopgood, Calimafde, Kalil, Blaustein & Judlowe

[57] ABSTRACT

In an article comprising a ceramic body fired at a comparatively low temperature and a circuit pattern attached to the body, the ceramic body is produced from a preselected composition comprising first powder of alumina and second powder of a vitreous material which comprises any one of $MgO-Al_2O_3-SiO_2$, $CaO-MgO-Al_2O_3-SiO_2$, $CaO-Al_2O_3-SiO_2$ glass, $CaO-Al_2O_3-SiO_2-B_2O_3$ glass, $MgO-Al_2O_3-SiO_2-B_2O_3$ glass, and $CaO-MgO-Al_2O_3SiO_2-B_2O_3$ glass. The ceramic body comprises coexistence of an alumina part, a noncrystallized part, and a crystallized part and exhibits an excellent moisture proof. The circuit pattern comprises an internal conductive pattern of Ag and an external conductive pattern of an alloy of Ag-Pd. A chromium component may be included in the internal and the external conductive patterns. External and internal resistor patterns are placed on and within the ceramic body with a high and a low precision. The internal resistor pattern can be adjusted by the use of a laser beam through a thin film included in the ceramic body.

21 Claims, 6 Drawing Figures

CERAMIC ARTICLE HAVING A HIGH MOISTURE PROOF

BACKGROUND OF THE INVENTION

This invention relates to a ceramic article for use in supporting or mounting a semiconductor chip or chips and to a method of manufacturing the same. It is to be noted throughout the instant specification that the ceramic article comprises a ceramic body and a conductive pattern attached to the ceramic body.

Recent demands have been directed towards a ceramic article which is fired at a low temperature lower than 1600° C., preferably lower than 1000° C. and which may often be referred to as a low temperature firing ceramic article. Such a ceramic article dispenses as conductive patterns with use of tungsten, molybdenum, or the like, which has a high melting point and which is liable to oxidation. In other words, the conductive patterns may be formed in such a ceramic article by noble metal, such as gold, an alloy of silver and palladium, which has a high electrical conductivity. This means that a resistance of the conductive patterns can be reduced by the use of such a high conductivity metal. Therefore, the above article may be applied to a very high speed computer like a super computer.

In Unexamined Japanese Patent Publication No. 17,651/1983 by H. Tozaki et al, a ceramic article is disclosed which comprises a ceramic body produced from a composition comprising a nonconductive crystalline oxide material and a vitreous or amorphous material. The nonconductive crystalline oxide material may be selected from alumina ($Al_2O_3$), silica ($SiO_2$), magnesia (MgO), calcium oxide (CaO), barium oxide (BaO), zirconia ($ZrO_2$), or the like. On the other hand, the vitreous material may be alumino and borosilicate lead glass. An alkali metal oxide, such as sodium oxide ($Na_2O$), lithium oxide ($Li_2O$), potassium oxide ($K_2O$), may be added to the vitreous material.

A conductive pattern of the noble metal may be attached to the above-mentioned ceramic body. A small amount of a vitreous material may be included in the conductive pattern in order to improve adhesion between the ceramic body and the conductive pattern.

At any rate, the ceramic body and the conductive pattern are simultaneously fired or cofired into the ceramic article. In this event, a resistor pattern and a capacitor pattern may be formed on the ceramic body together with the conductive pattern.

With this structure, the conductive pattern may be laid not only on a surface of the ceramic body but also inside of the ceramic body and is therefore divided into an external part and an internal part. The external and the internal parts are constituted by a common noble metal.

In the meanwhile, it has been found out that the above-mentioned ceramic article exhibits a low moisture proof on a moisture test when silver is used as the conductive patterns. As a result, migration and dielectric break down are liable to occur in the external part and in the ceramic body, respectively. The liability to migration and dielectric breakdown may be ascribed to presence of lead oxide and alkali metal oxide. Therefore, use of silver should be prohibited in the ceramic article.

Instead, gold or an alloy of silver and palladium must be attached as the conductive pattern to the ceramic body. However, the conductive pattern of gold makes the ceramic article expensive on one hand. On the other hand, the alloy of silver and palladium makes sheet resistances of the conductive patterns high. For example, the alloy of silver and palladium has a sheet resistance of 20 m$\Omega$/□ when it comprises by weight 80% silver and 20% palladium. Use of the silver and palladium alloy results in an inevitable reduction of electric characteristics of the article.

SUMMARY OF THE INVENTION

It is an object of this invention to provide a ceramic article which is capable of being fired at a low temperature between 800° C. and 1200° C.

It is another object of this invention to provide a ceramic article of the type described, which is inexpensive.

It is still another object of this invention to provide a ceramic article of the type described, which has an excellent moisture proof even when a conductive pattern of silver is attached to a ceramic body.

It is yet another object of this invention to provide a ceramic article of the type described, which can avoid migration and dielectric breakdown.

It is another object of this invention to provide a method which is capable of rapidly manufacturing a ceramic article of the type described.

According to this invention, an article comprises a ceramic body produced by firing a preselected composition at a temperature between 800° C. and 1200° C., both inclusive. The preselected composition comprises a first powder of alumina and a second powder of the vitreous material. The vitreous material comprises a glass composition selected from a group of MgO-$Al_2O_3$-$SiO_2$, CaO-MgO-$Al_2O_3$-$SiO_2$, CaO-$Al_2O_3$-$SiO_2$, CaO-$Al_2O_3$-$SiO_2$-$B_2O_3$, MgO-$Al_2O_3$-$SiO_2$-$B_2O_3$, and CaO-MgO-$Al_2O_3$-$SiO_2$-$B_2O_3$, and a circuit pattern attached to said ceramic body.

DESCRIPTION OF THE PREFERRED EMBODIMENTS

Figure 1:
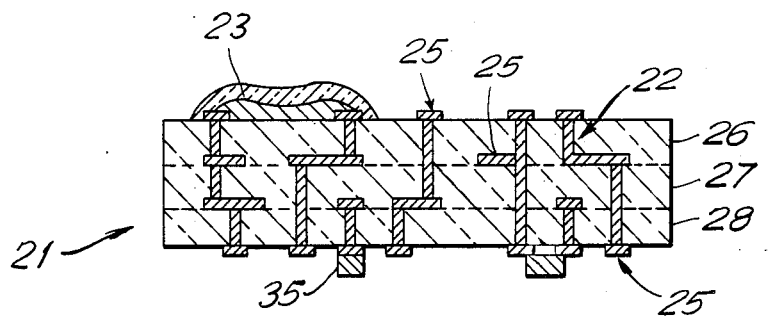
FIG. 1 is a sectional view of a ceramic article according to a first embodiment of this invention.

Referring to FIG. 1, a ceramic article according to a first embodiment of this invention comprises a ceramic body 21 surrounded by a body surface and an electric pattern 22 laid on the body surface and within the ceramic body. The electric pattern 22 is therefore divisible into an external and an internal part placed outside and inside of the ceramic body 21, respectively. The electric pattern 22 is also divided into element patterns 23 operable as electric elements, such as a resistor, a capacitor, and conductive patterns 25 associated with the element patterns 23. In this connection, the illustrated ceramic article may be called a hybrid or composite substrate for the conductive and the element patterns.

In order to facilitate an understanding of this invention, description will be directed to a method of manufacturing the illustrated ceramic body. At the outset, a preselected composition is prepared which comprises a first powder of alumina and a second powder of a vitreous material, namely, glass frit comprising a composition selected from silica ($SiO_2$), calcium oxide (CaO), magnesia (MgO), alumina ($Al_2O_3$), and boron trioxide ($B_2O_3$).

Specifically, the vitreous material may be either one of $CaO-Al_2O_3-SiO_2$ system glass, $CaO-Al_2O_3-SiO_2-B_2O_3$ system glass, $MgO-Al_2O_3-SiO_2-B_2O_3$ system glass, and $CaO-MgO-Al_2O_3-SiO_2-B_2O_3$ system glass. In the example, the vitreous material comprises by weight 10% to 55% of CaO, 45% to 70% of $SiO_2$, and 0% to 30% of $Al_2O_3$. The vitreous material may comprise by weight 0% to 30% of $B_2O_3$.

The second powder of the above-mentioned vitreous material is mixed with the first powder so that the preselected composition comprises by weight 50% to 65% of the second powder and 50% to 35% of the first powder. The preselected composition may comprise by weight up to 10% of an impurity except lead oxide. Alkali metal oxide should be equal to or less than 5% by weight. At any rate, it is to be noted that the preselected composition comprises no lead oxide.

A binder, a plasticizer, and a solvent are added to the preselected composition to form a slurry. The binder and plasticizer may be polymethacrylate ester and dibutyl phthalate, respectively, while the solvent may be toluene and isopropyl alcohl. The slurry is formed into a primary green sheet by the use of a doctor blade. The primary green sheet is 0.1–1.0 mm thick and cut into a lot of green sheet fractions which may simply be again called green sheets hereinunder.

According to the inventors' experimental studies, it has been found out that the above-mentioned green sheet of the preselected composition can be fired at a firing temperature between 800° C. and 1200° C., preferably, between 800° C. and 1000° C. On firing of the green sheet, shrinkage does not substantially take place in the green sheet near to 800° C. and is initially rapidly caused at the firing temperature. This is because softening and fusion occurs in the vitreous material of the preselected composition. Subsequently, partial crystallization is progressive between alumina particles and the vitreous material to form anorthite, cordierite, or the like in interfaces between the alumina particles and the vitreous material. Thus, the green sheet is fired into a ceramic block comprising in coexistence a noncrystallized part and a crystallized part.

It has been confirmed that the ceramic block has an excellent mechanical strength due to the abovementioned partial crystallization, a typical thermal expansion coefficient of $5.5 \times 10^{-6}/°$ C., and a typical specific gravity of 2.8. In addition, the dielectric constant, namely, relative permittivity of the ceramic block is equal to 7.5 at a frequency of 1 MHz. The above thermal expansion coefficient, specific gravity, and dielectric constant are lower than those of conventional ceramic bodies. Such a low thermal expansion coefficient makes it possible to mount an LSI of a large size on the ceramic body on one hand and such a low dielectric constant is useful to make the response to a signal fast on the other hand.

Moreover, no deformation is observed at all even when the ceramic block is reheated to a temperature range between 750° C. and 1000° C. This means that a heat treatment of the ceramic block can be repeated to the temperature range. In addition, the ceramic block has an excellent moisture proof because of appropriate amounts of the calcium oxide, the silica, the aluminum oxide, and the boron trioxide.

In order to manufacture the ceramic article illustrated in FIG. 1, first, second, and third ones of the green sheets are prepared to form first, second, and third layers 26, 27, and 28, respectively. Through holes are opened at predetermiend positions of the first through third green sheets in a known manner and may have diameters smaller than 200 micron meters. Inasmuch as the green sheets are readily workable, the through holes can be formed with a high density and a high precision.

After formation of the through holes, a conductive raw pattern is printed in a usual printing method for thick films to form the conductive pattern 25. The conductive raw pattern partially permeates into the green sheets and does not spread or blur on the green sheets. Therefore, the conductive raw pattern is printed on the green sheets with a high precision. In the illustrated example, the internal and the external parts of the conductive patterns are made of a first conductive material and a second conductive material different from the first conductive material, respectively. Under the circumstances, the through holes are filled with the first conductive material, as illustrated in FIG. 1.

Preferably, the first conductive material of the internal part essentially comprises silver and has a first sheet resistance which is not greater than 10 m$\Omega$/□ while the second conductive material of the external part essentially comprises an alloy of silver and palladium and has a second sheet resistance which is not smaller than 15 m$\Omega$/□. More preferably, the first conductive material comprises by weight 100% of silver and the first sheet resistance is about 3 m$\Omega$/□. In this case, the second conductive material comprises by weight 20% to 50% of palladium so that the second sheet resistance falls within a range between 20 m$\Omega$/□ and 65 m$\Omega$/□. At any rate, the first and the second conductive materials have a coefficient of shrinkage nearly equal to those of the green sheets.

Description will be made about the reason why such different conductive materials are used as the internal and the external parts of the conductive pattern. For a better understanding of this invention, it is assumed that the external part is made of silver which is readily diffused in the presence of water. Let two adjacent electrodes of the external part be immersed or wetted by a waterdrop. Under the circumstances, silver is drastically diffused or migrated from one electrode to another in use. Such migration of silver is reduced in dependency on an amount of palladium. In order to avoid the above-mentioned migration, the illustrated ceramic article comprises, as the first and the second conductive materials, silver and the alloy of silver and palladium, respectively, as described before. Specifically, the second conductive material is printed on the first and the third green sheets and in the through holes of each green sheet while the first conductive material is printed on the second and third green sheets.

In the interim, if a ceramic layer is poor in moisture proof, the silver might be diffused into the ceramic layer and deeply soaked in the presence of water. As a result, this makes a breakdown voltage of the ceramic layer undesiredly low because a thickness of the ceramic layer is equivalently reduced by the diffusion of silver into the ceramic layer.

The above exemplified ceramic block is excellent in moisture proof and therefore has a high breakdown voltage.

After printing of the first and the second conductive materials, the first through third green sheets are dried and stacked together into a stacked body. Subsequently, the stacked body is fired in the air at a firing temperature between 800° C. and 1200° C., preferably, between 800° C. and 1000° C. Thus, the conductive raw patterns and the first through third green sheets are simultaneously fired or cofired into the conductive patterns 25 and the first through third layers 26 to 28, respectively, and are united into the ceramic body 21.

No shrinkage crack has been observed in the ceramic body 21. This is because the coefficients of shrinkage of the first and the second conductive materials approximate those of the green sheets, as mentioned before.

After cofiring, resistor paste is printed on the first layer 26 in the known manner and is dried to form as the element patterns 23 resistor patterns which are represented by a single resistor pattern in FIG. 1. The resistor paste mainly comprises ruthenium oxide ($RuO_2$).

The ceramic body is thereafter fired again in an oxidizing atmosphere at a temperature between 750° C. and 950° C., with the resistor paste attached thereto. In other words, the resistor paste is fired into the resistor patterns 23. Subsequently, the resistor patterns 23 are covered with a protection layer 33 and finally trimmed by the use of a laser beam so as to adjust resistances of the resistor patterns 23 to desired values.

In FIG. 1, two semiconductor chips which are collectively depicted at 35 are mounted on the external part of the conductive patterns.

Figure 2:
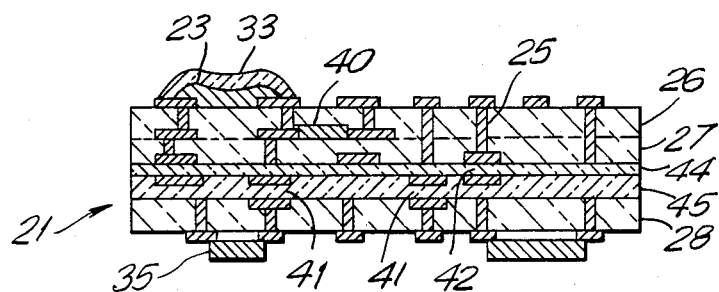
FIG. 2 is a sectional view of a ceramic article according to a second embodiment of this invention.

Referring to FIG. 2, a ceramic article according to a second embodiment of this invention comprises similar parts designated by like reference numerals. In FIG. 2, it is to be noted that the ceramic article comprises, as the element patterns, an internal resistor 40 and first and second internal capacitors 41 and 42 which will become clear later. The internal resistor 40 and the first and second internal capacitors 41 and 42 are associated with the conductive patterns 25.

The internal resistor 40 is formed on the second layer 27 in the manner similar to the resistor pattern 23 which is formed on the body surface of the ceramic body 21. Each of the first internal capacitors 41 may have a high dielectric constant and a large capacitance. For the purpose, a fourth green sheet is prepared to form a fourth layer 44 having a dielectric constant greater than those of the first through third layers 26 to 28. The fourth green sheet can be obtained by using additives, such as $Pb(Fe_{\frac{1}{2}}W_{\frac{1}{2}})-Pb(Fe_{\frac{1}{2}}Nb_{\frac{1}{2}})O_2$. Although lead is included as the additives in the fourth layer 44, undesired diffusion or migration does not occur from the fourth layer 44 because the fourth layer 44 is not exposed to an ambient atmosphere and is isolated from the ambient atmosphere by the second and the third layers 27 and 28 having excellent moisture proof, as mentioned with reference to FIG. 1. Thus, the dielectric constant of the fourth layer 44 can be increased in comparison with the first through third layers 26 to 28 without a reduction of the moisture proof.

In FIG. 2, a fifth green sheet 45 is also prepared to form the second internal capacitors 42 which are operable as temperature-compensating capacitors. The fifth green sheet 45 is obtained by adding, to the pre selected composition described in conjunction with FIG. 1, a dielectric material, such as $MgTiO_3$, which has a dielectric constant variable with a negative thermal coefficient.

The fifth green sheet is laid between the fourth and the third green sheets and fired in the manner described in conjunction with FIG. 1 to be united into the ceramic body 21 illustrated in FIG. 2. As a result, the fourth and the fifth layers 44 and 45 are interposed between the second and the third layers 27 and 28 with the fourth and the fifth layers 44 and 45 brought into contact with the second and the third layers 27 and 28, respectively.

As illustrated in FIG. 2, the first and the second capacitors 41 and 42 are laterally and vertically adjacent to one another. With this structure, any crosstalk might appear between adjacent ones of the capcitors. However, the crosstalk can be removed by printing guard electrodes on both surfaces of each of the fourth and the fifth layers 44 and 45 or the like.

Figure 3:
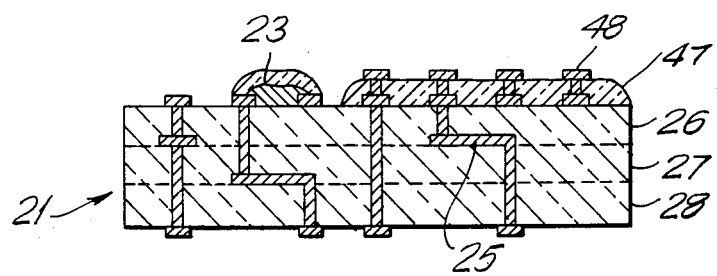
FIG. 3 is a sectional view of a ceramic article according to a third embodiment of this invention.

Referring to FIG. 3, a ceramic article according to a third embodiment of this invention comprises similar parts designated by like reference numerals. In FIG. 3, the first through third layers 26 to 28 are united into the ceramic body 21 together with the conductive patterns 25 in the above-mentioned manner. The resistor pattern 23 is also formed on the body surface like in FIGS. 1 and 2.

In FIG. 3, an insulator layer 47 is selectively printed on the body surface together with the resistor pattern 23 in a manner similar to the conductive and the resistor patterns 25 and 23. The insulator layer 47 has via holes at prescribed positions. Preferably, the insulator layer 47 comprises the same composition as the first through third layers 26 to 28. In other words, the insulator layer 47 is formed by printing insulator paste comprising a compound identical with the green sheets and by simultaneously firing the insulator paste and the green sheets.

Surface conductive patterns 48 of copper (Cu) are formed in a usual manner on the insulator layer 47 and in the via holes of the insulator layer 47.

Although the conductive patterns 25 are composed of either the first conductive material or the second conductive material in the ceramic articles illustrated in FIGS. 1 through 3, each of the first and the second conductive materials may be modified to improve wettability for solder without a reduction of adhesion to the ceramic sheets described with reference to FIG. 1.

More particularly, a first sample of the modified conductive materials is produced from a conductive paste comprising by weight 100 parts of silver powder, 1 part of chromium powder, and 40 parts of 10% solution of ethyl cellulose terpineol. The silver powder and chromium powder have average particle sizes of 1.5 micron meters and 2.0 micron meters, respectively. The conductive paste is printed on the green sheet in the usual manner to a thickness of 12 micron meters and is thereafter fired at a temperature of 820° C. for thirty minutes to form a modified conductive pattern.

The wettability for solder was evaluated by measuring a variation of a height of a solder ball which has a diameter of 3 mm and which comprises by weight 60% of tin and 40% of lead. Specifically, the solder ball was placed on the modified conductive pattern and heated at 230° C. for thirty seconds. As a result, the solder ball was melted on the modified conductive pattern and reduced the height thereof. It is to be noted that the lower is the height of the melted ball, the better will be the wettability. Specifically, the height of the melted ball may be equal to or lower than 1.5 mm.

As regards the first sample, the height of the melted ball was equal to 1.2 mm.

Similar evaluation was made about second through fifteenth samples listed in Table 1.

TABLE 1

| Sample | Noble Metal | | | | Glass frit part by weight | Cr | | Other Additive | Wettability |
|---|---|---|---|---|---|---|---|---|---|
| | Ag | Pd | Pt | Au | | Species | Quantity part by weight | | |
| 1 | 100 | 0 | 0 | 0 | 0 | Metal Cr | 1.0 | — | 1.20 |
| 2 | 80 | 20 | " | " | " | " | 0.01 | — | 1.47 |
| 3 | " | " | " | " | " | " | 0.5 | — | 1.30 |
| 4 | " | " | " | " | " | " | 1.0 | — | 1.18 |
| 5 | " | " | " | " | " | " | 3.0 | — | 1.34 |
| 6 | " | " | " | " | " | " | 5.0 | — | 1.39 |
| 7 | " | " | " | " | " | " | 8.0 | — | 1.46 |
| 8 | " | " | " | " | " | $Cr_2(SO_4)_3$ | 1.0 | — | 1.20 |
| 9 | " | " | " | " | " | $Cr_2O_3$ | 0.5 | — | 1.42 |
| 10 | " | " | " | " | 2 | Metal Cr | 0.5 | — | 1.39 |
| 11 | " | " | " | " | 5 | " | 0.5 | — | 1.20 |
| 12 | " | " | " | " | 10 | " | 1.0 | — | 1.40 |
| 13 | 95 | 0 | 5 | 0 | 0 | " | 1.0 | — | 1.32 |
| 14 | " | 0 | 0 | 5 | 0 | " | 1.0 | — | 1.20 |
| 15 | 80 | 20 | " | 0 | 0 | " | 1.0 | $Bi_2O_3$ 1.0 | 1.22 |

Each of the second through seventh samples comprises by weight 80 parts of Ag, 20 parts of Pd, and 0.01 to 8.0 parts of chromium. The eighth and ninth samples comprise by weight 1.0 part of chromic sulfate ($Cr_2(SO_4)_3$) and 0.5 part of chromic oxide ($Cr_2O_3$), respectively, in addition to 80 parts of Ag and 20 parts of Pd. The tenth through twelfth samples comprise glass frit and chromium together with 80 parts of Ag and 20 parts of Pd. Specifically, the tenth sample comprises by weight 2 parts of the glass frit and 0.5 part of Cr while the eleventh and twelfth samples comprise 5 and 10 parts of the glass frit and 0.5 and 1.0 part of Cr, respectively. The thirteenth and fourteenth samples comprise 5 parts of platinum (Pt) and 5 parts of gold (Au) instead of Pd, respectively, together with 95 parts of Ag and 1 part of Cr. The fifteenth sample comprises by weight 1 part of $Bi_2O_3$ and 1.0 part of Cr together with 80 parts of Ag and 20 parts of Pd.

As shown in Table 1, all of the first through fifteenth samples exhibit excellent wettability. It has been found out that 0.01 to 8 parts of chromium component, such as chromium, chromic oxide, chromic sulfate, may be added to 100 parts of a noble metal component, selected from Ag, Pd, Pt, and Au when the chromium component is represented in terms of chromium. In addition, an amount of a vitreous material or glass frit is between 0 part and 10 parts.

Figure 4:
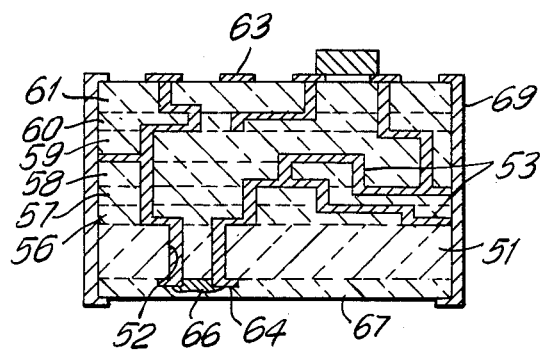
FIG. 4 is a sectional view of a ceramic article according to a fourth embodiment of this invention.

Referring to FIG. 4, a ceramic article according to a fourth embodiment of this invention in manufactured in a manner different from those illustrated in FIGS. 1 through 3. In FIG. 4, a green sheet 51 is at first prepared which comprises a preselected composition, like the first through third green sheets described in conjunction with FIGS. 1 through 3. The preselected composition therefore comprises the first powder of $Al_2O_3$ and the second powder of the vitreous material. The vitreous material comprises by weight 0% to 30% of $Al_2O_3$, 45% to 70% of $SiO_2$, 0% to 30% of $B_2O_3$, and 10% to 55% of MO, where MO represents CaO and/or MgO. The preselected composition comprises by weight 50% to 65% of the vitreous material, the balance being the first powder.

The illustrated green sheet 51 has an upper surface directed upwards of FIG. 4, a lower surface opposite to the upper surface, and a plurality of through holes 52 contiguous to the upper and the lower surfaces. The green sheet 51 is about 700 micron meters thick. A first one of internal conductive patterns 53 of Ag is printed in the known manner on the upper surface and in the through holes and is thereafter dried.

Subsequently, an insulation paste is prepared which comprises a composition similar to the preselected composition. The insulation paste is printed in a manner similar to the internal conductive patterns 53 to form a first insulator film 56 which has a plurality of via holes. A second one of the internal conductive patterns 53 is also printed on the first insulator film 56 and in the via holes in a like manner.

Likewise, the insulation paste and the internal conductive patterns 53 are successively printed and stacked to form second through sixth insulator films 57 to 61. Thus, the first through sixth insulator films 56 to 61 form an insulator block overlying the upper surface of the green sheet 51 and providing a block surface.

On the block surface, external conductive patterns 63 are printed in a similar manner. The external patterns 63 are of an alloy of Ag and Pd, comprising by weight 20% of Pd and having a sheet resistance between 20 m$\Omega$/□ and 30 m$\Omega$/□. Additional external patterns 64 are also printed on the lower surface of the green sheet 51 and are formed by an alloy of Ag and Pd similar to the above-mentioned external conductive patterns 63. After printing of the additional conductive patterns 64, resistor paste is printed between the additional conductive patterns 64 to form a resistor 66. The resistor 66 may comprise a composition of glass and $RuO_2$, a mixture of glass and $Bi_2Ru_2O_7$, or a compound of pyrochlore type, such as $Pb_2$-$Ru_2O_6$. Anyway, the resistor 66 has an electrical resistance in dependency upon an amount of glass. Oxides, such as $MnO_2$, $Sb_2O_3$, and $Fe_2O_3$, or metals, such as Ag, Au, and Pt may be added to the resistor 66 so as to adjust temperature dependency of the resistance.

It is mentioned here that the glass added to the resistor is of a composition similar to that of each of the green sheet 51 and the first through sixth insulator films 56 to 61, so as to avoid deformation or voids which might result from noncoincidence of contraction between the resistor paste and the green sheet 51 and from diffusion and reaction of glasses used in the resistor paste and the green sheet 51. Preferably, the glass in the resistor 66 is identical with the vitreous material included in the green sheet 51.

In FIG. 4, the resistor 66 is covered with an additional insulator film 67 to form a stacked body illustrated in FIG. 4. The additional insulator film 67 is formed in a manner similar to each of the first through sixth insulator films 56 to 61. The stacked body has an upper article surface defined by the block surface, a lower article surface provided by the additional insulator film 67, and a side surface contiguous to the upper and the lower article surfaces.

A plurality of terminal electrodes 69 are printed on the side surface. Each terminal electrode 69 has extensions partially extended on the upper and lower article surfaces, as illustrated in FIG. 4.

After formation of the terminal electrodes 69, the stacked body is fired or baked at a temperature of 900° C. in air atmosphere into the ceramic article comprising a ceramic layer, first through sixth ceramic films, and an additional ceramic film which result from the green sheet 51, the first through sixth insulator films 56 to 61, and the additional insulator film 67, respectively. Each of the ceramic layer, the first through sixth ceramic films, and the additional ceramic film finally comprises by weight 35% to 65% of $Al_2O_3$, 22.5% to 45.5% of $SiO_2$, 0% to 19.5% of $B_2O_3$, and 5% to 35.75% of MO, where M represents Ca and/or Mg.

Subsequently, the resistor 66 is trimmed by the use of a YAG laser beam of 4 watts, so as to precisely adjust a resistance of the resistor 66 to a desired value. The trimming is possible in spite of the fact that the resistor 66 is covered with the additional insulator film 67 when the additional insulator film 67 is produced from the preselected composition. This is because the additional insulator film 67 comprises an alumina part, the noncrystallized part (matrix part), and the crystallized part comprising cordierite ($Mg_2(Al_4Si_5O_{18})$) and anorthite and the resistor 66 is covered with the additional insulator film 67 again even when the additional insulator film 67 is partially melted by the laser beam.

Under the circumstances, an amount of the alumina included in the additional insulator film 67 alone may be reduced to 20% by weight. In this case, it is undesirable in view of mechanical strength of the ceramic article to render an amount of alumina in the remaining insulator films equal to or less than 35% by weight.

Description will be made about dielectric characteristics of each of the ceramic layer 51 and the ceramic films 56 to 61 and 67, as all described above.

Table 2 shows relationships between the dielectric characteristics and first through fifth ceramic samples each of which comprises different compositions of the above-mentioned vitreous materials.

TABLE 2

| Ceramic Samples. | | 1 | 2 | 3 | 4 | 5 |
|---|---|---|---|---|---|---|
| Composition (wt %) | $SiO_2$ | 50 | 63.6 | 54.4 | 51 | 51.7 |
| | $Al_2O_3$ | 13.6 | 9.1 | 14.3 | 14.9 | 15 |
| | CaO | 27.3 | 18.2 | 22.4 | 1.2 | — |
| | MgO | — | — | 0.6 | 16.3 | 16.7 |
| | $B_2O_3$ | 9.1 | 9.1 | 8.2 | 16.6 | 16.7 |
| | $Na_2O + K_2O$ | <0.1 | <0.1 | 0.7 | <0.1 | <0.1 |
| Glass/Alumina (wt %) | | 60/40 | 60/40 | 60/40 | 60/40 | 55/45 |
| Insulation Resistance ($\Omega$) | | $>10^{14}$ | $>10^{14}$ | $>10^{14}$ | $>10^{14}$ | $>10^{14}$ |
| Breakdown voltage (KV) | | >4K | >4K | >4K | >4K | >4K |

As shown in Table 2, each vitreous material of the first through fifth ceramic samples falls within those ranges of $SiO_2$, $Al_2O_3$, $B_2O_3$, and MO which are enumerated before. Each vitreous material, namely, glass is mixed with the alumina at a rate listed in Table 2.

Each of the first through fifth ceramic samples comprises a sheet and a film on the sheet which are manufactured, as described in conjunction with FIG. 4. The film has a thickness of 30 micron meters. Each sample has first and second conductive patterns which are mounted on the sheet and the film, respectively, and which have predetermined contours, respectively. Each conductive pattern is of Ag.

Under the circumstances, an insulation resistance is measured as one of the dielectric characteristics by supplying a voltage of 100 volts between the first and second conductive patterns of each of the first through fifth ceramic samples. As a result of measurement, it has been found out that the insulation resistance of each of the first through fifth ceramic samples is initially greater than $10^{14}$ $\Omega$, as listed in Table 2. The samples are subjected to a humidity test during 250 hours at a high temperature of 65° C. with a relative humidity kept at 95% and with a d.c. voltage of 40 volts loaded. It has been confirmed that each insulation resistance is substantially invariable after the humidity test despite that silver which has a strong tendency to diffuse is used in each conductive pattern.

A breakdown voltage is also measured as another one of the dielectric characteristics by supplying an increasing d.c. voltage between the first and second conductive patterns. As shown in Table 1, all of the samples have the breakdown voltages greater than 4 kilovolts.

The breakdown voltage is also measured after a humidity test similar to that described in conjunction with the insulation resistance. As a result, it has been found out that the breakdown voltage is scarcely changed in each of the first through fifth ceramic samples.

From this fact, it is understood that each of the first through fifth ceramic samples has excellent dielectric characteristics and prominent moisture proof and weather proof. It seems that the preselected composition includes no lead component and a small amount of alkali metal components.

Any vitreous material is used to control the resistances of resistors as mentioned before. Let the vitreous material include lead monoxide (PbO) and be exposed to a reducing atmosphere. In this event, the lead monoxide is reduced into lead metal which is operable as a movable component. Consequently, the resistances might irregularly fluctuate due to the lead metal.

The green sheets and the insulator films, such as 51, 56 to 61 and 67, include a great amount of organic compounds, such as binder. When the organic compounds are fired on baking the green sheets and the like, an internal part of each sheet is inevitably rendered into a reducing atmosphere. Accordingly, presence of the lead monoxide makes the resistances fluctuate.

In any event, each resistance of the resistors, such as 66, is kept constant in the illustrated ceramic articles because any lead component is not included in the resistors.

In addition, when the vitreous materials are included in both of the resistors and the ceramic sheets or films, any undesired drift of the vitreous materials occur between the resistors and the ceramic sheets or films. Such an undesired drift can be avoided by addition of $Al_2O_3$ to the resistors when the resistors include a greater amount of the vitreous materials than the ceramic sheets or films. This is because the addition of $Al_2O_3$ serves to reduce an amount of the vitreous materials in the resistors and to render the same equal to an amount of the vitreous materials included in the ceramic sheets or films. The other components of 0% to 10% may be added to the resistors so as to adjust a temperature characteristic.

Anyway, the resistors are produced from the resistor paste comprising the above-mentioned components. In addition, organic polymers, ethyl cellulose, acrylic acid resins, may be included as resistor components in the resistor paste.

Table 3 shows first through sixth resistor samples each of which comprises a glass or vitreous material identical with that of the third ceramic sample listed in Table 2. The glass or vitreous material is mixed with $Al_2O_3$ and $RuO_2$, as enumerated in Table 3. The other materials may be added to a total of the glass material, $Al_2O_3$, and $RuO_2$. Accordingly, amounts of the other materials are represented by a relative ratio to the total weight of the glass material, $Al_2O_3$, and $RuO_2$.

TABLE 3

| Resistor Samples | Glass (wt %) | $Al_2O_3$ (wt %) | $RuO_2$ (wt %) | Other Materials (wt %) | Resistance ($\Omega/\Box$) |
|---|---|---|---|---|---|
| 1 | 50 | 0 | 50 | 10 | 39 |
| 2 | 48 | 12 | 40 | 10 | 207 |
| 3 | 60 | 15 | 25 | 4 | 2.78K |
| 4 | 64 | 16 | 20 | 0 | 11.0K |
| 5 | 50 | 34 | 16 | 0 | 304K |
| 6 | 52 | 34 | 14 | 0 | 2.1 M |

It has been found out that each of the first through sixth resistor samples exhibits a stable resistance regardless of a firing atmosphere including oxygen or nitrogen. In other words, a variation of the resistance can be reduced in the above-mentioned resistors.

As described before, the resistors may be trimmed by the use of the laser beam even when they are covered with an insulator film, such as 67. For example, the resistor 66 is placed at a position 0.05 mm deep. According to the inventors' experimental studies, the resistor 66 can be trimmed by the use of a usual laser beam through the insulator film 67 to be adjusted to a desired value. The trimmed resistor 66 is covered again with the insulator film 67 after trimming of the resistor 66. This might ascribe to the fact that the insulator film 67 comprises coexistence of the crystallized part and the non-crystallized part, as mentioned with reference to FIG. 1. Accordingly, internal elements, such as the resistor 66, can be formed with a high precision.

In order to facilitate the trimming, absorptivity can be improved by adding coloring agents, such as $Cr_2O_3$, $CoO$, $Fe_2O_3$, $NiO$, to the vitreous materials.

Figure 5:
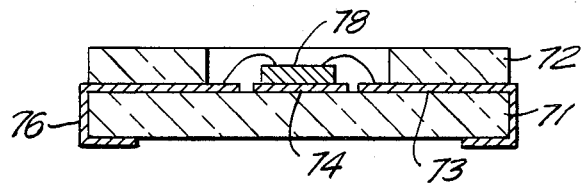
FIG. 5 is a sectional view of a ceramic article according to a fifth embodiment of this invention.

Referring to FIG. 5, a ceramic article according to a fifth embodiment of this invention is used as a chip carrier and comprises a substrate element 71 and a wall element 72 both of which are manufactured by the use of first and second green sheets similar to the green sheets described in conjunction with FIGS. 1 through 4, respectively. On the first green sheet, conductor patterns 73 are printed in a usual manner by the use of conductor paste comprising silver, gold, or an alloy of silver and palladium. A bonding pad 74 is also printed on the first green sheet by the use of gold paste or silver and palladium paste.

The second green sheet is stacked on the first green sheet to form a stacked body as illustrated in FIG. 5. Side electrodes 76 are attached to the conductive patterns 73 by the use of silver or silver and palladium paste. Thereafter, the stacked body is fired into the chip carrier in the air at a temperature of 900° C. A semiconductor chip 78 is mounted onto the bonding pad 74.

With this structure, each of the conductor patterns 73, the bonding pad 74, and the side electrodes 76 is of noble metal, such as gold, silver, or an alloy of silver and palladium. This is because the green sheets can be fired at a low temperature, such as 900° C. In other words, any high-temperature material, such as tungsten, molybdenum, is not used in the illustrated chip carrier. Therefore, plating becomes unnecessary due to use of the noble metal. This means that extra wirings necessary for the plating may be removed from each green sheet. A lot of substrate elements 71 and the wall elements 72 are therefore obtained from a single green sheet.

Figure 6:
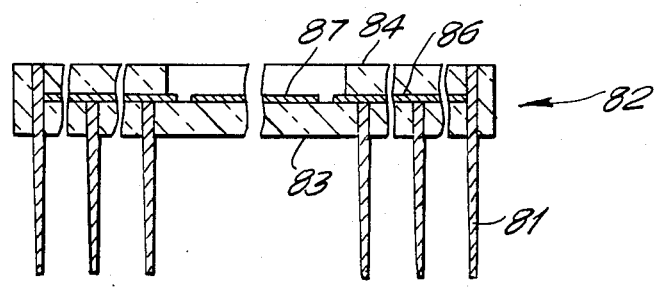
FIG. 6 is a sectional view of a ceramic article according to a sixth embodiment of this invention.

Referring to FIG. 6, a ceramic article according to a sixth embodiment of this invention is used as a pin grid array (PGA) comprising a plurality of pins 81. The number of the pins 81 may be equal, for example, to 208.

It is to be noted here that the pins 81 comprise a rod and a layer of silver coated on the rod and are inserted into a ceramic body 82. The rod may be of an alloy of nickel-cobalt-iron, an alloy of nickel-cobalt-chromium-iron, or stainless steel.

On manufacturing the illustrated pin grid array, first and second green sheets are prepared to form a bottom element 83 and an upper element 84 attached to the bottom element 83, respectively. A plurality of through holes are opened on the first and the second green sheets to receive the pins 81 and have diameters which are somewhat greater than the pins 81.

Conductive patterns 86 for interconnection and a bonding pad 87 are printed on the first and second green sheets by the use of silver and palladium paste or gold paste. The conductive patterns 86 are partly printed into the through holes.

Subsequently, the first and second green sheets are stacked by hot pressing to form a laminated body. Under the circumstances, the laminated body is fired at a temperature of 900° C.

Alternatively, the pins 81 can be attached to a ceramic body by solder after firing of the laminated body like in the conventional pin grid array.

The pin grid array illustrated in FIG. 6 can readily be manufactured in comparison with a conventional pin grid array and is therefore very inexpensive.

While this invention has thus far been described in conjunction with several embodiments thereof, it will readily be possible for those skilled in the art to put this invention into practice in various other manners. For example, this invention is applicable to a substrate for a thermal lead or to a package of a plug-in type for an LSI. The ceramic layer or films described in conjunction with FIGS. 1 through 6 may partly be included in the ceramic body or block and may be combined with another type of ceramic layer or layers.

What is claimed is:

1. In an article comprising a ceramic body and a circuit pattern attached to said ceramic body, the improvement wherein said ceramic body is partially crystallized by firing a preselected composition at a temperature between 800° C. and 1200° C., said preselected composition comprising by weight 50% to 35% of a first powder of alumina and 50% to 65% of a second powder of a vitreous material, said second powder comprising by weight 45% to 70% of $SiO_2$, 0% to 30% of $Al_2O_3$, 0% to 30% of $B_2O_3$, at least one of CaO and MgO between 10% and 55% in total, and alkali metal oxide which is not greater than 5%, without comprising PbO, said ceramic body essentially consisting of alumina particles resulting from said first powder, a noncrystallized part, and a crystallized part between said alumina particles and said noncrystallized part.

2. An article as claimed in claim 1, wherein said alkali metal oxide is not greater than 0.7% by weight.

3. An article as claimed in claim 1 wherein the partially crystallized ceramic body comprises by weight 22.5% to 45.5% of $SiO_2$, 35% to 65% of $Al_2O_3$, 0% to 19.5% of $B_2O_3$, and at least one of CaO and MgO, the total of CaO and MgO being between 5% and 35.75%.

4. An article as claimed in claim 2 wherein the partially crystallized ceramic body comprises by weight 22.5% to 45.5% of $SiO_2$, 35% to 65% of $Al_2O_3$, 0% to 19.5% of $B_2O_3$, and at least one of CaO and MgO, the total of CaO and MgO being between 5% and 35.75%.

5. An article as claimed in claim 1, said ceramic body being surrounded by a body surface, wherein said circuit pattern comprises:
an internal pattern which is composed of a first conductive material and placed in said ceramic body; and
an external pattern which is composed of a second conductive material different from said first conductive material and which is laid on said body surface.

6. An article as claimed in claim 5, wherein said internal pattern has a first sheet resistance which is not greater than 10 m$\Omega$/□ while said external pattern has a second sheet resistance which is greater than 10 m$\Omega$/□.

7. An article as claimed in claim 6, wherein said second sheet resistance is between 20 m$\Omega$/□ and 65 m$\Omega$/□.

8. An article as claimed in claim 6, wherein said internal pattern is of silver while said external pattern is of an alloy of silver and palladium.

9. An article as claimed in claim 5, wherein said second conductive material has migration smaller than said first conductive material.

10. An article as claimed in claim 1, wherein said circuit pattern includes either a material selected from the group consisting of chromium and chromium oxide.

11. An article as claimed in claim 10, wherein said circuit pattern comprises at least one species of noble metal selected from the group consisting of silver, palladium, platinum, and gold.

12. An article as claimed in claim 1, wherein said circuit pattern is produced from a mixture of a chromium component, a noble metal component, and a vitreous component.

13. An article as claimed in claim 12, wherein said chromium component is one from the group consisting of chromium and chromium oxide.

14. An article as claimed in claim 13, wherein said mixture comprises by weight 0.01 to 8 parts of chromium, 100 parts of said noble metal component, and 0 to 10 parts of the vitreous component.

15. An article as claimed in claim 14, wherein said noble metal component comprises at least one species of noble metal selected from the group consisting of silver, palladium, platinum, and gold.

16. An article as claimed in claim 1, wherein said circuit pattern comprises:
an element pattern operable as an electric element; and
a conductive pattern electrically associated with said element pattern.

17. An article as claimed in claim 16, wherein said electric element is a resistor.

18. An article as claimed in claim 16, wherein said electric element is a capacitor.

19. An article as claimed in claim 16, said ceramic body being surrounded by a body surface, wherein said element pattern comprises a first element pattern buried in said body and connected to said conductive pattern and a second element pattern laid on said body surface and coupled to said conductive pattern.

20. An article as claimed in claim 19, wherein said conductive pattern comprises a first conductive part placed inside of said ceramic body and connected to said first element pattern and a second conductive part placed outside of said ceramic body and electrically connected to said first element pattern and said first conductive part.

21. An article as claimed in claim 20, wherein said first element pattern has a precision lower than said second element pattern.

* * * * *